United States Patent
Nakamura

[11] Patent Number: 5,219,079
[45] Date of Patent: Jun. 15, 1993

[54] WAFER JIG
[75] Inventor: Tomofumi Nakamura, Kyoto, Japan
[73] Assignee: Rohm Co., Ltd., Kyoto, Japan
[21] Appl. No.: 873,383
[22] Filed: Apr. 24, 1992
[30] Foreign Application Priority Data
  Oct. 11, 1991 [JP] Japan .................. 3-263914
[51] Int. Cl.[5] .............................................. A47F 7/00
[52] U.S. Cl. .................................... 211/41; 118/500; 206/454
[58] Field of Search .............. 211/40, 41; 118/500, 118/728; 206/454

[56] References Cited
U.S. PATENT DOCUMENTS

| | | | |
|---|---|---|---|
| 3,465,892 | 9/1969 | Taylor | 211/41 |
| 3,534,862 | 10/1970 | Shambelan | 211/41 |
| 4,653,650 | 3/1987 | Schülke | 211/41 |
| 4,949,848 | 8/1990 | Kos | 118/500 X |
| 5,054,418 | 10/1991 | Thompson et al. | 211/41 X |
| 5,131,546 | 7/1992 | Kodera | 211/41 |

Primary Examiner—Robert W. Gibson, Jr.
Attorney, Agent, or Firm—Thomas R. Morrison

[57] ABSTRACT

A wafer jig which can relieve a decline in precision of wafer processing is provided. Wafers (30) under processing are placed on supporting plates (6) and, in this condition, set into a heating furnace. This condition allows any possible warp of wafer due to its own weight to be eliminated. Further, particles (dust) contaminating the back side of the wafer (30) do not fall onto a processing surface of another wafer (30) thereunder. Moreover, the wafer (30) is placed in such a way that it is isolated from pillars (4) by a distance (L2) and, for this reason, gas flow disturbance which occurs in the vicinity of pillars does not lower the precision of wafer processing. In addition, a slit (7) which is provided for the supporting plate (6) facilitates wafer conveyance.

13 Claims, 2 Drawing Sheets

WAFER JIG

BACKGROUND OF THE INVENTION

1. Field of the Invention

The present invention relates to the structure of a jig for supporting wafers and, more particularly, to the structure which can relieve a decline in precision of wafer processing.

2. Description of the Prior Art

In manufacturing process of integrated circuits, impurities such as ions are doped to the surface of a silicon wafer or the like, and then made to diffuse therein. A diffusion layer thus formed is used for forming circuit elements of the integrated circuit. When performing above diffusion, wafers are first set into a heating furnace with impurities doped thereon. Then the furnace is filled with gas or the like, and heating is carried out under high temperature.

The heating furnace contains a large number of wafers so as to allow simultaneous heat-treatment. Wafers at this step are supported by the jig and set into the heating furnace. A conventional wafer jig is shown in a general perspective view in FIG. 1A. This wafer jig 40 is for a vertical heating furnace, made up of a roof plate 41, a bottom plate 42, and four pillars 43 for fixing the roof plate 41 and the bottom plate 42. Wafers 30 are put in at regular intervals between the roof plate 41 and the bottom plate 42.

Support of wafers 30 is conducted as follows. Each pillar 43 is provided with a plurality of recessed parts 49, as shown in FIG. 1B. This structure allows each wafer 30 to be inserted in each recessed part 49 and supported there. FIG. 1C shows in a plane view the state in which the wafer is supported by four pillars 43.

However, the conventional wafer jig has the following problems. First, although using a wafer of large size is effective for efficient manufacture of integrated circuits, such a large-sized wafer 30 is liable to curve or warp due to its own weight when supported by four pillars 43.

Second, integrated circuits should be processed with strict precision. Particles (dust) or the like are possible contaminant against the processing surface, making final products less reliable. The conventional wafer jig 40 of FIG. 1 allows wafers 30 to be placed at close intervals from each other. As a result, if particles contaminate one wafer 30 at the back thereof, they may fall onto the processing surface of another wafer 30 thereunder. Particles thus added on the processing surface are responsible for a decline in precision of wafer processing, allowing final products to be less reliable, as described above.

Moreover, gas flow is made to disturb near each pillar 43, because wafers 30 are directly supported by pillars 43. In other words, gas is not uniformly supplied in the vicinity 48 of recessed parts 49 where wafers 30 are inserted thereto and make contact with pillars 43. Consequently, wafer processing is not conducted as desired, leading to the problem of a decline in precision of wafer processing.

OBJECTS AND SUMMARY OF THE INVENTION

An object of the present invention, therefore, is to provide a wafer jig which can relieve a decline in precision of wafer processing.

According to a feature of the invention, there is provided a wafer jig for containing a plurality of wafers comprising:

a plurality of supporting plates for placing a plurality of wafers; and a fixing component for fixing the supporting plates in such a manner as to form a plurality of insertion spaces between the supporting plates.

While the novel features of the invention are set forth in a general fashion, particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIGS. 1A-1C are drawings of a conventional wafer jig, wherein: FIG. 1A is a general perspective view; FIG. 1B is a side view of a pillar; and FIG. 1C is a plane view of a wafer supported pillars.

FIGS. 2A-2C are drawings of a wafer jig according to an embodiment of the present invention, wherein: FIG. 2A is a general perspective view; FIG. 2B is a plane view of a supporting plate; FIG. 2C is a plane view of a state in which a wafer is placed on the supporting plate.

DESCRIPTION OF THE PREFERRED EMBODIMENT

Figure 2A:
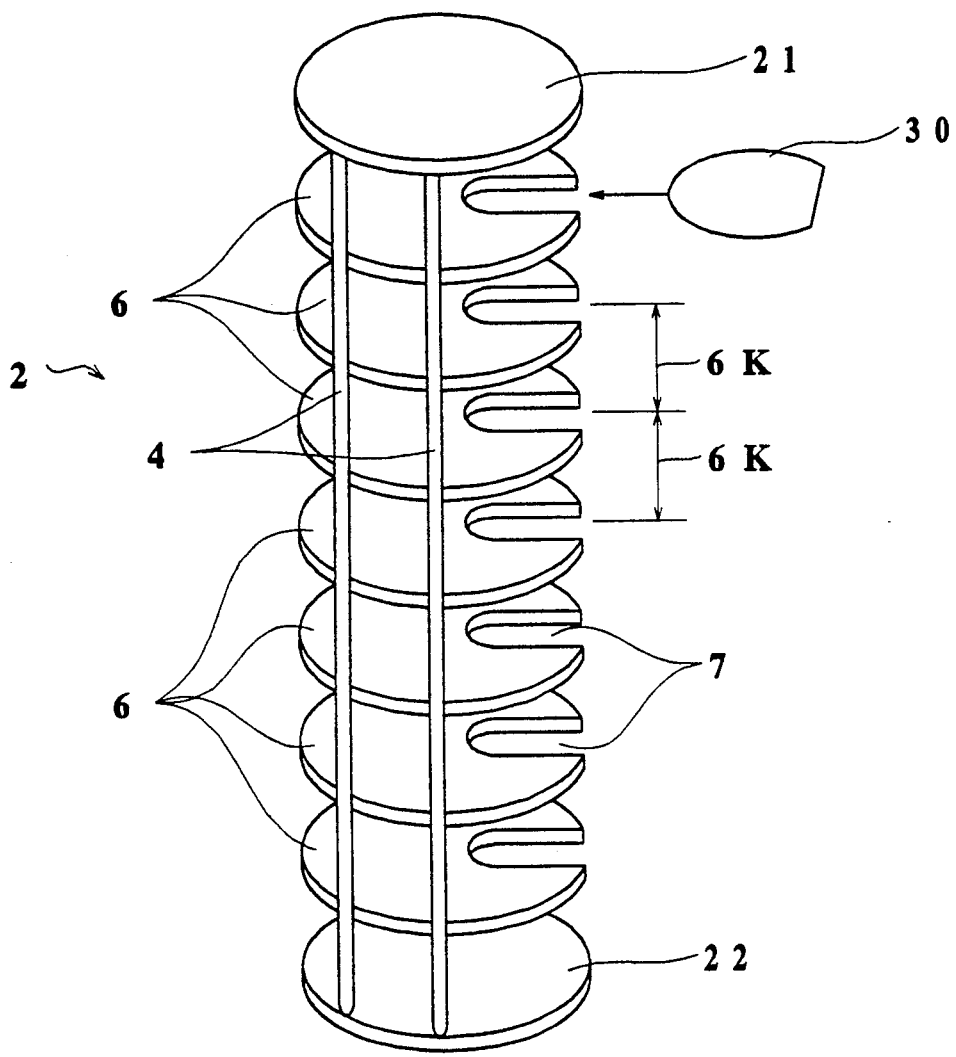

A wafer jig according to an embodiment of the present invention will be described in accordance with drawings hereinafter. In FIG. 2A, there is shown a general perspective view of a wafer jig 2. The wafer jig 2 includes a roof plate 21 at the top end thereof, a bottom plate 22 at the bottom end thereof, and a plurality of supporting plates 6 therebetween which are installed at every insertion spaces 6K. The roof plate 21, the bottom plate 22, and every supporting plates 6 are fixed to pillars 4 acting as fixing component.

Figure 2B:
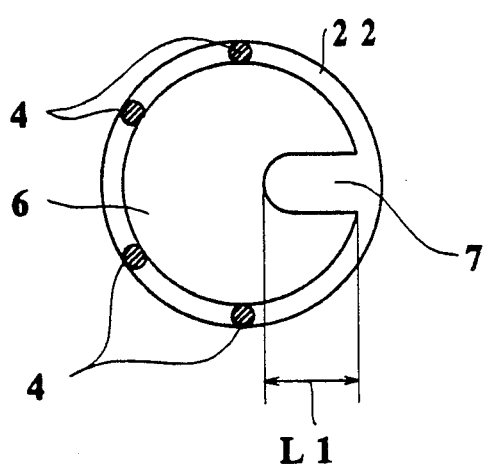

In FIG. 2B, there is shown a plane view of the supporting plate 6. As can be seen from the figure, the supporting plate 6 is provided with a slit 7 which is a cutout formed by cutting away by a cutting length L1. A wafer 30 under processing is placed on the supporting plate 6 having such a slit 7. In other words, each of wafers 30 is inserted into each insertion spaces 6K one by one, and placed on the supporting plate 6.

Figure 2C:
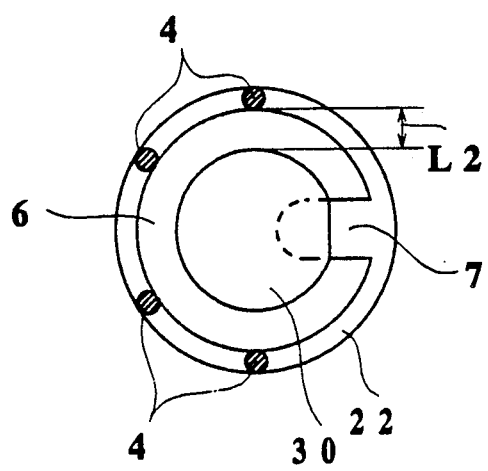

In FIG. 2C, there is shown a plane view of a state in which the wafer 30 is placed on the supporting plate 6. In the wafer 30 in this condition, the back side thereof is partly emerged from the slit 7, as can be seen from the figure. This is because the slit 7 is so formed that the cutting length L1 thereof extends to the wafer 30 placed on the supporting plate 6. As a result, the wafer 30 conveyed from the previous place can be readily put in the fixed position of the supporting plate 6 with the aid of the slit 7.

Wafers 30 are placed on supporting plates 6 as described above and, in this condition, set into a vertical type heating furnace (not shown). Ions or other impurities are doped to the processing surface of the wafer 30 before heating, and thereafter heated along with gas or the like in the heating furnace, with temperature increased to high. By the above-mentioned diffusion process, impurities are made to diffuse into the wafer 30 and form a diffusion layer. The diffusion layer thus formed is used for forming circuit elements of the integrated circuit.

Subsequent to diffusion process, the wafer jig 2 containing wafers is taken out from the heating furnace and subjected to the next step. When removing the wafer 30 lying on the supporting plate 6, the slit 7 which is provided for the supporting plate 6 facilitates lifting up the wafer 30 as well. This is especially true when lifting up and conveyance are conducted using arms of a conveying robot.

Figure 1A:
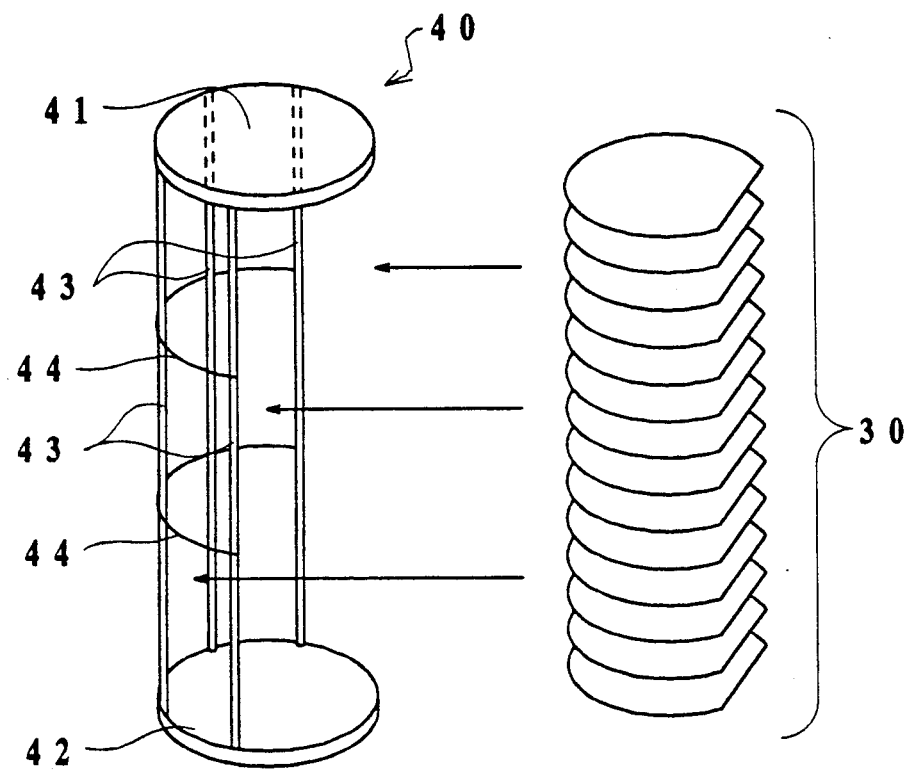
Figure 1B:
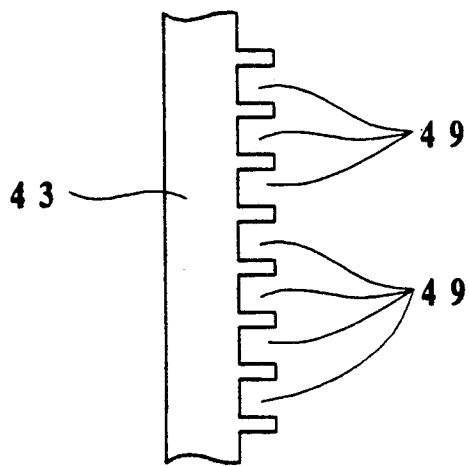
Figure 1C:
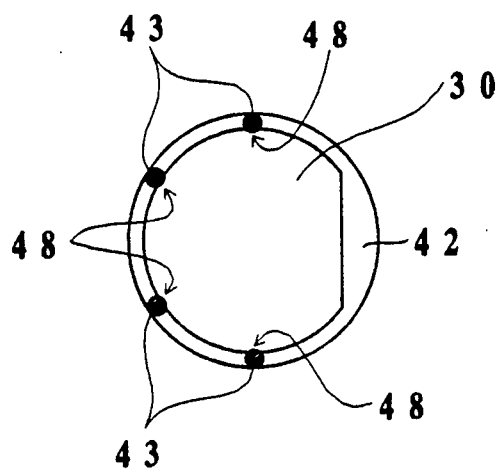

As shown in FIG. 2C, the wafer 30 is supported in the state that it is placed on the surface of the supporting plate 6. As a result, support of wafers 30 can be done more stably, as compared with the conventional jig in which wafers 30 are inserted in the recessed parts 49 (FIG. 1) of the jig and supported there. Therefore, any possible curvature due to its own weight can be eliminated, thus preventing the wafer 30 from warping.

Further, particles (dust) or the like are possible contaminants against the back side of the wafer 30. In this wafer jig, however, the wafer 30 is placed on supporting plates 6, so that contaminating particles may not fall onto processing surface of another wafer 30 thereunder. For this reason, decline in precision of wafer processing due to contaminants against a processing surface can be suppressed.

Moreover, the wafer 30 is placed on the supporting plate 6 in such a way that it is isolated from the pillar 4 by a distance L2 (see FIG. 2C). As a result, during heat-treatment in the heating furnace, wafers 30 are not directly exposed to disturbed gas flow which occurs in the vicinity of pillars 4. In other words, gas is uniformly supplied to processing surfaces of wafers 30, thus wafer processing can be conducted properly.

In a wafer jig of the present invention, any possible warp of wafer due to its own weight is suppressed. Further, dust or the like contaminating the back side of a wafer does not fall onto a processing surface of another wafer thereunder. Moreover, wafers are not supported by the fixing component directly, but by supporting plates. Consequently, gas flow disturbance which occurs in the vicinity of pillars 4 does not affect wafer processing, allowing the decline in precision of wafer processing to be avoided.

In a wafer jig of the present invention, a supporting plate is provided with a cutout, so that wafer placement thereon and wafer removal therefrom are facilitated. Therefore, efficiency in wafer processing can be improved.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A wafer jig for containing a plurality of wafers, comprising:
   a plurality of parallel supporting plates for receiving back sides of said plurality of wafers;
   means for fixing said supporting plates to form a plurality of insertion spaces between said supporting plates; and
   said plurality of supporting plates having dimensions larger than a dimension of said backs sides of each of said plurality of wafers.

2. A wafer jig as claimed in claim 1, wherein each of said plurality of supporting plates has a cutout from which a part of said back side of said wafer placed thereon emerges.

3. A wafer jig for containing a plurality of wafers wherein each wafer has front and back surfaces, comprising:
   a plurality of supporting plates for supporting said back surfaces of said plurality of wafers
   said supporting plates including means for preventing said plurality of wafers from warping; and
   means for fixing said supporting plates to form a plurality of insertion spaces between said supporting plates.

4. A wafer jig according to claim 3, wherein each of said plurality of supporting plates has a cutout effective for exposing a portion of said back surface of said wafer placed thereon.

5. A wafer jig according to claim 3, wherein said supporting plates are effective to reduce movement of contaminants between said plurality of wafers.

6. A water jig according to claim 3, wherein each of said plurality of supporting plates have an surface area larger than each of said plurality of wafers for allowing said front surfaces of said plurality of wafers to receive uniform treatment.

7. A wafer jig according to claim 3, wherein said plurality of supporting plates are horizontal.

8. A wafer jig according to claim 3, wherein said means for fixing further comprises:
   a top plate;
   a plurality of pillars having first and second ends;
   said first ends connected to said top plate;
   a bottom plate; and
   said second ends being connected to said bottom plate.

9. A wafer jig for containing a plurality of wafers wherein each wafer has front and back surfaces, comprising:
   a plurality of horizontal supporting plates for supporting said back surfaces of said plurality of wafers;
   means for fixing said supporting plates to form a plurality of insertion spaces between said supporting plates;
   each of said plurality of supporting plates having a cutout effective for exposing a portion of said back surface of said wafer placed thereon;
   said supporting plates being effective to reduce movement of contaminants between said plurality of wafers;
   said supporting plates including means for preventing said plurality of wafers from warping; and
   each of said plurality of supporting plates have an surface area larger than each of said plurality of wafers for allowing said front surfaces of said plurality of wafers to receive uniform treatment.

10. A wafer jig for containing a plurality of wafers wherein each wafer having front and back surfaces, comprising:
    a plurality of supporting plates for supporting said back surfaces of said plurality of wafers;
    a plurality of pillars having first and second ends;
    said plurality of supporting plates being connected to said pillars effective to form a plurality of insertion spaces between said supporting plates;

said plurality of supporting plates including means for preventing said plurality of wafers from warping; and said plurality of pillars having smooth surfaces at least between adjacent pairs of said supporting plates.

11. A wafer jig for containing a plurality of wafers wherein each wafer has front and back surfaces, comprising:
- a plurality of supporting plates for supporting said back surfaces of said plurality of wafers;
- said plurality of supporting plates including means for preventing said plurality of wafers from warping;
- each of said plurality of supporting plates having a cutout effective for exposing a portion of said back surface of said wafer placed thereon;
- a top plate;
- a plurality of pillars having first and second ends;
- said first ends connected to said top plate;
- a bottom plate; and
- said second ends being connected to said bottom plate; and
- said plurality of supporting plates being connected to said pillars thereby being effective to form a rigid structure having a plurality of insertion spaces between said supporting plates.

12. A wafer jig for containing a plurality of wafers wherein each wafer has front and back surfaces, comprising:
- a plurality of supporting plates for supporting said back surfaces of said plurality of wafers;
- each of said plurality of supporting plates being larger than each of said plurality of wafers; and
- means for fixing said supporting plates to form a plurality of insertion spaces between said supporting plates.

13. A wafer jig for containing at least one wafer having upper and lower sides, comprising:
- top and bottom horizontal round plates;
- a plurality of parallel, vertical pillars connecting said top and bottom plates;
- at least one horizontal wafer-supporting plate between said top and bottom plates for receiving said lower side of said at least one wafer;
- said at least one horizontal wafer-supporting plate being larger than said at least one wafer;
- said at least one horizontal wafer-supporting plate being connected at its periphery to said plurality of pillars;
- said at least one wafer-supporting plate being disposed to leave a space between at least one of an upper and lower surface of said at least one wafer-supporting plate and at least one of a next higher element;
- said space being sufficient to permit placement of said wafer therein for processing;
- said wafer-supporting plates being effective to prevent movement of contaminants between said at least one wafer and said at least one of next higher and next lower element;
- said plurality of pillars being disposed about said at least one wafer-supporting plate effective to create a gap between first and second adjacent ones thereof, having a width substantially greater than a width of said at least one wafer;
- said at least one wafer-supporting plate having a cut-out;
- said cut-out being disposed on a portion of said at least one wafer-supporting plate within said gap;
- said duct-out having a width and depth sufficient to permit placing of said at least one wafer on said upper surface of said at least one wafer-supporting plate, thereby allowing for insertion and removal of said wafer therefrom;
- said plurality of pillars being disposed at least a first predetermined distance from a center of said wafer-supporting plate; and
- said predetermined distance being larger than a radius of said at least one wafer, whereby a minimum space between an edge of said wafer-supporting plate and a nearest one of said plurality of pillars is a second predetermined distance.

* * * * *